(12) United States Patent
Greiser

(10) Patent No.: US 8,570,039 B2
(45) Date of Patent: Oct. 29, 2013

(54) METHOD AND DEVICE FOR PHASE-SENSITIVE FLOW MEASUREMENT BY MAGNETIC RESONANCE

(75) Inventor: Andreas Greiser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 398 days.

(21) Appl. No.: 12/964,892

(22) Filed: Dec. 10, 2010

(65) Prior Publication Data

US 2011/0140698 A1 Jun. 16, 2011

(30) Foreign Application Priority Data

Dec. 10, 2009 (DE) .......................... 10 2009 057 721

(51) Int. Cl.
*G01V 3/00* (2006.01)

(52) U.S. Cl.
USPC .......................................................... 324/309

(58) Field of Classification Search
USPC ................................................. 324/300–322
See application file for complete search history.

(56) References Cited

U.S. PATENT DOCUMENTS

| | | | |
|---|---|---|---|
| 4,714,081 A * | 12/1987 | Dumoulin et al. | 600/419 |
| 2001/0027262 A1 * | 10/2001 | Mistretta et al. | 600/9 |

OTHER PUBLICATIONS

Edelman, et al., Clinical Magnetic Resonance Imaging, vol. 1, 2nd ed., 1996, ch. 9, MR Angiography: Basic Principles, pp. 285-293.*
"Baseline Correction of Phase Contrast Images Improves Quantification of Blood Flow in the Great Vessels," Chernobelsky et al., Journal of Cardiovascular Magnetic Resonance, vol. 9 (2007) pp. 681-685.
"Temporal Stability of the Background Velocity Error Supports Automated Correction of Flow Measurement," Gatehouse et al., Proc. Intl. Soc. Mag. Reson. Med. vol. 16 (2008) p. 391.
"Correction of Phrase Offset Errors in Main Pulmonary Artery Flow Quantification," Lankhaar et al., Journal of Magnetic Resonance Imaging, Vo. 22 (2005) pp. 73-79.

* cited by examiner

*Primary Examiner* — Melissa Koval
*Assistant Examiner* — Daniel Miller
(74) *Attorney, Agent, or Firm* — Schiff Hardin LLP

(57) ABSTRACT

In a method and a device for phase-sensitive flow measurement of a volume segment of an examination subject using a magnetic resonance (MR) system, the volume segment is coded for imaging of this volume segment and a phase coding of the volume segment to code flow information of the volume segment is implemented. MR data are read out from the volume segment and the MR data are evaluated in order to generate an image of the volume segment with flow information. The phase coding to code the flow information is thereby independent of gradients which are used for spatial coding of the volume segment.

9 Claims, 4 Drawing Sheets

METHOD AND DEVICE FOR PHASE-SENSITIVE FLOW MEASUREMENT BY MAGNETIC RESONANCE

BACKGROUND OF THE INVENTION

1. Field of the Invention

The present invention concerns a method and a device for phase-sensitive flow measurement of a volume segment of an examination subject, using a magnetic resonance system.

2. Description of the Prior Art

In a phase-sensitive flow measurement (data acquisition) in a magnetic resonance (MR) system (for example a phase contrast flow measurement), additional bipolar gradient trains are superimposed on the gradient configuration required for imaging, in order to impress a gradient moment of the 1st order on the MR signal of a fluid that is to be detected. Flow coding is thereby achieved. The lower the flow velocities that are to be measured, the larger the moments that must be generated with the magnetic resonance system by the bipolar gradients. Under the additional boundary condition of an optimally short measurement duration, very strong gradient pulses must be used, which lead to eddy current fields within the volume segment to be measured or the slice to be measured. The acquired flow velocity information thus is disadvantageously adulterated.

For measurement of a flow within a vessel, the slices to be measured are typically aligned so as to be perpendicular to the longitudinal direction of this vessel. A flow coding gradient direction therefore also lies perpendicular to this longitudinal direction of the vessel. Since the longitudinal direction of the vessel coincides with one of the three basic spatial directions or gradient axes of the magnetic resonance system only in the rarest cases, the bipolar gradients for flow coding typically have physical components with regard to all three gradient axes or basic spatial directions. This individual slice alignment, aligned on the vessel to be examined, therefore leads to the situation that the exposure fields likewise occur individually in the acquired flow images as background phase effects with different directions and dimensions for every measurement. The exposure effects are thereby even more significantly intensified by the coupling of the different gradient directions, this coupling being dependent on the slice direction.

The following possibilities to correct background phases in phase-sensitive flow measurement that occur due to the eddy current effects exist according to the prior art.

The background phases can be corrected by reference measurements of a stationary phantom. For these measurements, however, protocol step repetitions with exactly identical settings are required for each patient, so the time duration to implement the phase-sensitive flow measurement is more than doubled. See "Baseline Correction of Phase Contrast Images Improves Quantification of Blood Flow in the Great Vessels" by A. Chernobelsky et al., Journal of Cardiovascular Magnetic Resonance 2007, Vol. 9, No. 4, Pages 681-685.

Another approach is to measure and store reference measurements of the phantom in advance for all conceivable parameter settings, in particular for all possible slice orientations. The data measured for a patient are then corrected with the aid of that phantom data set which best matches the parameter setting which is used for the current measurement protocol of the patient. See "Temporal stability of the background velocity error supports automated correction of flow measurements", P. D. Gatehouse et al., Proc. Intl. Soc. Mag. Reson. Med. 16 (2008), Page 391.

According to a further approach, the background phase is corrected by means of an intrinsic reference. For this a hypersurface is adapted to stationary pixels, wherein it is assumed that this hypersurface sufficiently approximates the background phase contributing to the flow signal at the location of the vessel so that the errors occurring due to the background phase can be corrected. See "Correction of Phase Offset Errors in Main Pulmonary Artery Flow Quantification", by J.-W. Lankhaar et al., JOURNAL OF MAGNETIC RESONANCE IMAGING 22 (2005), Pages 73-79.

Most approaches known according to the prior art are based on a subsequent correction of the background phase using reference information. Approaches are also known to model the eddy current effects or to detect them independent of the imaging itself.

SUMMARY OF THE INVENTION

In contrast to these known techniques, the present invention has the object to reduce the eddy current effects themselves (and therefore the background phase) in comparison to a phase-sensitive flow measurement according to the prior art.

In accordance with the present invention a method for phase-sensitive flow measurement of a volume segment of an examination subject (for example a patient) using a magnetic resonance system includes the following steps:

Create a spatial coding of the volume segment (i.e. of a slice or of a three-dimensional volume) for imaging of this volume segment.

Create a phase coding of the volume segment in order to code flow information of the volume segment. The phase coding—which is not to be confused with the phase coding gradient for spatial coding—is thereby in particular overlaid on the spatial coding. For example, in a phase contrast flow measurement this step comprises at least two sub-steps. In a first sub-step a flow-compensated phase coding is created and in a second sub-step the actual phase coding for coding the flow information is generated.

Readout of the MR data from the volume segment. In the phase contrast flow measurement the results of the flow-compensated phase coding are read out in a first sub-step and the results of the actual phase coding to code the flow information are read out in a second sub-step. The second sub-step can include additional sub-steps, as is described in further detail in the following.

Evaluation of the MR data in order to generate an image of the volume segment together with flow information of the volume segment.

The phase coding to code the flow information is thereby independent of an orientation of the magnetic field gradients which are used for spatial coding or, respectively, for imaging. This means that the gradients generated for phase coding of the flow information—in particular the directions of these gradients—are independent of directions in which the three gradients for spatial resolution of the spins within the volume segment are shifted.

The magnetic field gradients for imaging (i.e. the imaging magnetic field gradients) should not be confused with the three basic magnetic field gradients that are generated by the magnetic resonance system in the three basic spatial directions (X-, Y- and Z-direction) of the magnetic resonance system. Instead, every one of the imaging magnetic field gradients in the general case (i.e. the volume segment to be examined is situated at an angle to the coordinate system of the magnetic field resonance system) is generated by a superimposition of the three basic magnetic field gradients.

For spatial coding the orientation of the slice selection gradient, the phase coding gradient and the frequency coding gradient in a two-dimensional measurement method are directed according to the alignment of the slice to be measured, which, in the case of a flow measurement, is located perpendicularly to a vessel (for example the aorta) in which the flow is to be measured. In order to now measure the flow perpendicular to this slice, according to the prior art a bipolar gradient is generated in a direction which exhibits the slice selection gradient and said bipolar gradient is overlaid on the gradient for spatial coding. In other words, the phase coding to code the flow information according to the prior art is dependent on the orientation of those gradients with which the spatial coding is implemented. Expressed differently, the phase coding to code the flow information according to the prior art is dependent on an orientation of the gradients which are generated for imaging.

In a preferred embodiment of the invention, the phase coding to encode the flow information is produced along only one of the three basic spatial directions of the magnetic resonance system. This means that, according to the invention, the (bipolar) gradients for flow coding are generated along only one of the three spatial directions of the magnetic resonance system and are superimposed on the gradients used for spatial coding. One of these three basic spatial directions corresponds to a direction (z-direction) in which a table can be moved through the magnetic resonance system. The two basic spatial directions (x-direction and y-direction) are perpendicular to one another and to the z-direction. Only one gradient coil of the magnetic resonance system is required to generate a gradient (Gx, Gy or Gz) in one of the three basic spatial directions. By contrast, at least two and at most three gradient coils of the magnetic resonance system are required to generate a gradient in a direction different than the three spatial directions.

The use of multiple gradient coils to generate a gradient disadvantageously leads to a coupling, which is avoided by the present invention at least in the generation of the phase coding gradients to code the flow information.

In a further embodiment according to the invention, the flow information is determined as follows:
  In a first step a first flow information is determined in a first of the three basic spatial directions via a phase coding for flow measurement along this basic spatial direction.
  In a second step a second flow information is similarly determined in a second of the three basic spatial directions via a phase coding for flow measurement along this basic spatial direction.
  In a third step a third flow information is determined in a third (the remaining) of the three basic spatial directions via a phase coding along this basic spatial direction.
  The flow information is determined via a superimposition of the first, second and third flow information.

This embodiment advantageously detects the entire flow vector field and not only the portion of the flow velocity whose direction lies perpendicular to the slice plane, as this is the case in the technique known as "Through-Plane Flow Coding" that is typical according to the prior art. The present invention therefore also enables the visualization of the entire flow vector field, for example in that the maximum velocity (independent of the direction) is determined and represented in color per pixel.

Normally a flow-compensated measurement is implemented before these three steps, and that the flow information of the respective step is created from the difference from the result data of the respective step and the result data of the flow-compensated measurement.

Since, in this embodiment, the flow information takes place in three steps, after each of these steps it is also possible to correct an error which is present within the flow information acquired in this step.

For example, for this purpose it is possible to implement a calibration measurement for each of the three basic spatial directions in advance using a volume measurement, in which calibration measurement flow information in this basic spatial direction is determined via a phase coding for flow measurement along this basic spatial direction at a phantom (for example an immobile liquid). Flow information that is acquired during the step corresponding to this basic spatial direction can then be corrected accordingly using these results of the calibration measurement.

Since the flow information is always implemented only by means of the same phase coding for flow measurement along the three basic spatial directions, independent of the alignment of the slice to be measured or the volume unit to be measured, only three items of correction information (one for each basic spatial direction) are advantageously required, which means an enormous savings in comparison to correction methods according to the prior art in which an item of correction information is required for every possible slice orientation.

The present invention can be implemented with a two-dimensional measurement method or with a three-dimensional measurement method. A two-dimensional measurement method means a method in which the MR data are acquired in a measurement workflow, or with a sequence diagram, for a slice and in which k-space is two-dimensional. In contrast to this, in a three-dimensional measurement method the MR data are acquired in a measurement workflow, or with a sequence diagram for a volume, such that k-space is three-dimensional. The predetermined volume segment corresponds to a slice if the present invention is implemented with a two-dimensional measurement method and the predetermined volume segment corresponds to a volume if the present invention is implemented with a three-dimensional measurement method.

The present invention also encompasses a device for a magnetic resonance system for phase-sensitive flow measurement of a volume segment of an examination subject. The device includes an activation unit to activate the magnetic resonance system, a receiver device to receive MR data acquired by the magnetic resonance system within the volume segment and an evaluation device to evaluate the MR data. By means of the activation unit the device generates a coding of the volume segment for imaging of said volume segment. Moreover, by means of the activation unit the device generates a phase coding of the volume segment to code a flow information of said volume segment which in particular is superimposed on the coding for imaging. By means of the receiver device, the device reads MR data from the volume segment and evaluates these MR data by means of the evaluation device in order to generate an image of the volume segment with flow information. The device thereby executes the phase coding to code the flow measurement by means of the activation unit such that the phase coding is independent of the alignment of magnetic field gradients which the device uses during the coding for imaging.

The advantages of the device according to the invention essentially correspond to the advantages of the method according to the invention which are stated in detail in the preceding.

Moreover, the present invention encompasses a magnetic resonance system that includes the device according to the invention as described in the preceding.

The present invention also encompasses a non-transitory computer-readable storage medium encoded with programming instructions. When the storage medium is loaded into a computerized control and evaluation system of a magnetic resonance system, the programming instructions cause the computerized control and evaluation system to execute the above-described method, including all embodiments thereof.

The storage medium may be, for example, a DVD, a magnetic tape, or a USB stick. Storage medium may require components such as libraries and auxiliary units in order to realize the embodiments of the method. The programming instructions software can be a source code (for example C++) that must still be compiled and linked, or that only needs to be interpreted, or can be an executable software code that need only to be loaded into a computer for execution.

DESCRIPTION OF THE PREFERRED EMBODIMENTS

Figure 1:
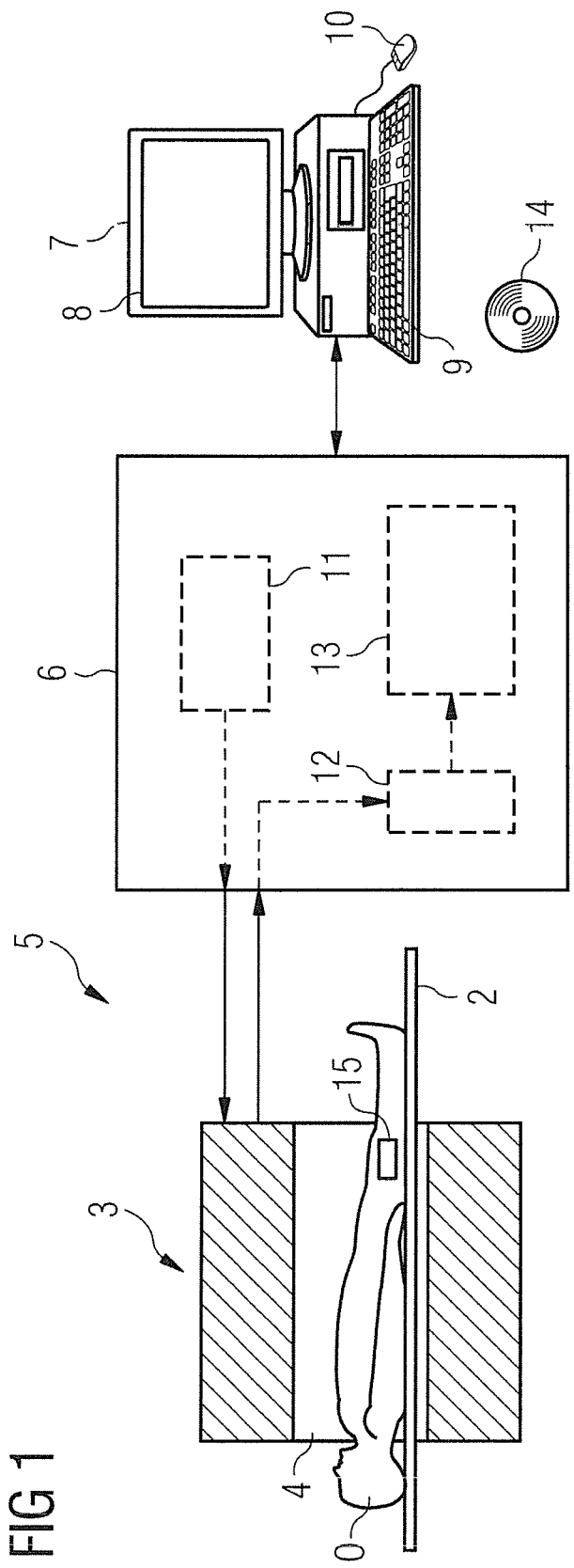
FIG. 1 schematically depicts a magnetic resonance system according to the invention with a control device according to the invention.

A magnetic resonance system 5 according to the invention is schematically shown in FIG. 1. The magnetic resonance system 5 includes a scanner 3 with which the magnetic fields necessary for the MR examination are generated in a measurement space 4, a patient table 2, a control device 6 according to the invention with which the scanner 3 is controlled and MR data from the scanner 3 are recorded, and a terminal 7 connected to the control device 6.

The control device 6 includes an activation unit 11, a receiver device 12 and an evaluation device 13. During a phase-sensitive flow measurement MR data are recorded by the receiver device 12 by means of the scanner 3, wherein the scanner 3 and the table 2 are activated by the activation unit 11 such that MR data are acquired in a measurement volume 15 that is located inside the body of a patient O lying on the table 2.

The evaluation device 13 then prepares the MR data such that they can be graphically presented on a monitor 8 of the terminal 7 and such that images generated according to the invention can be displayed. In addition to the graphical presentation of the MR data, a three-dimensional volume segment (for example) to be measured can be predetermined by a user and additional parameters to implement the method according to the invention can be defined with the terminal 7 (which has a keyboard 9 and a mouse 10 in addition to the monitor 8). The software for the control device 6 can also be loaded into said control device 6 via the terminal 7. This software of the control device 6 can thereby also comprise the method according to the invention. It is also possible for a method according to the invention to be embodied in software which runs in the terminal 7. Independent of the software in which the method according to the invention is embodied, the software can be stored on a DVD 14 so that the software can then be read from the DVD 14 by the terminal 7 and be copied either into the control device 6 or into a computer of the terminal 7 itself.

According to the prior art, in a phase-sensitive flow measurement the background phase is dependent on the orientation of that slice in which the flow is measured.

In the following it is assumed that the same measurement protocol is implemented for different slice orientations. The slice normal in the first slice is thereby aligned in the direction of the z-axis, meaning that an axial slice orientation exists. The slice orientation is subsequently tilted further from slice to slice (from measurement to measurement) until the slice normal is aligned in the direction of the y-axis in the last slice (measurement), thus a coronal slice orientation exists.

The background phase in these measurements is then least when the slice orientation corresponds to one of the three basic spatial directions of the magnetic resonance system, as is the case in the first and last measurement. The more that the slice orientation deviates from the three basic spatial directions, the stronger the background phase as well.

Figure 2:
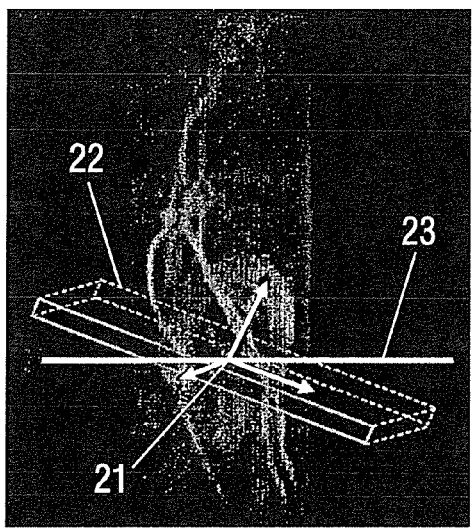
FIGS. 2 and 3 compare the procedure according to the invention with a procedure according to the prior art.
Figure 3:
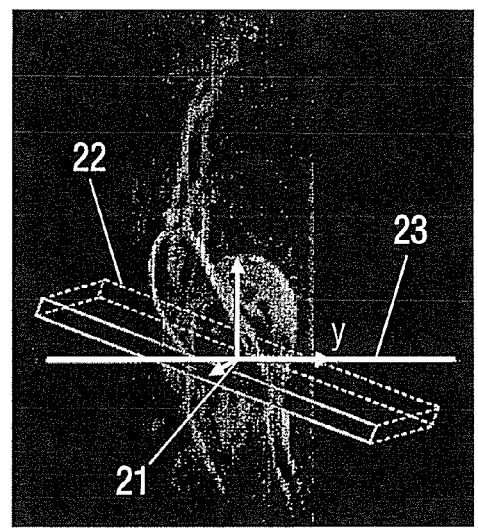

The reason for the dependency of the background phase on the slice orientation in the prior art is due to the fact that the alignment of the gradients which are used for coding of the flow information depends on the slice orientation, as this is explained with the aid of FIGS. 2 and 3.

How the gradients for flow coding are aligned according to the prior art (see FIG. 2) and according to the present invention (see FIG. 3) is shown in FIGS. 2 and 3. According to the prior art, the gradients for flow measurement are generated in the same reference system as the gradients for spatial coding of the slice 22, as this is shown in FIG. 2 using the coordinate system 21. Since the slice 22 is situated at an angle to the coordinate system of the magnetic resonance system (which coordinate system consists of the three basic spatial directions of the magnetic resonance system) which is depicted with the aid of an axis 23 in FIGS. 2 and 3, the coordinate system 21 in FIG. 2 also forms an angle relative to the actual coordinate system of the magnetic resonance system or, respectively, to the axis 23. To code the flow information along one of the axes of the coordinate system 21, in the shown case all three gradient coils of the magnetic resonance system must thereby be used in order to generate a gradient for flow coding along one of the axes of the coordinate system 21. This disadvantageously leads to a coupling of these gradient coils, so the background phase is intensified.

In contrast to this, in the present invention the gradients for flow measurement are always generated only along one of the three basic spatial directions of the magnetic resonance system, as this is shown using the coordinate system 21 in FIG. 3. Since the gradients for flow measurement according to the invention are always generated only along the three basic spatial directions of the magnetic resonance system, the phase coding to code the flow information according to the invention is independent of the orientation of the gradients for spatial coding or imaging and therefore is independent of the orientation of the slice 22.

Figure 4:
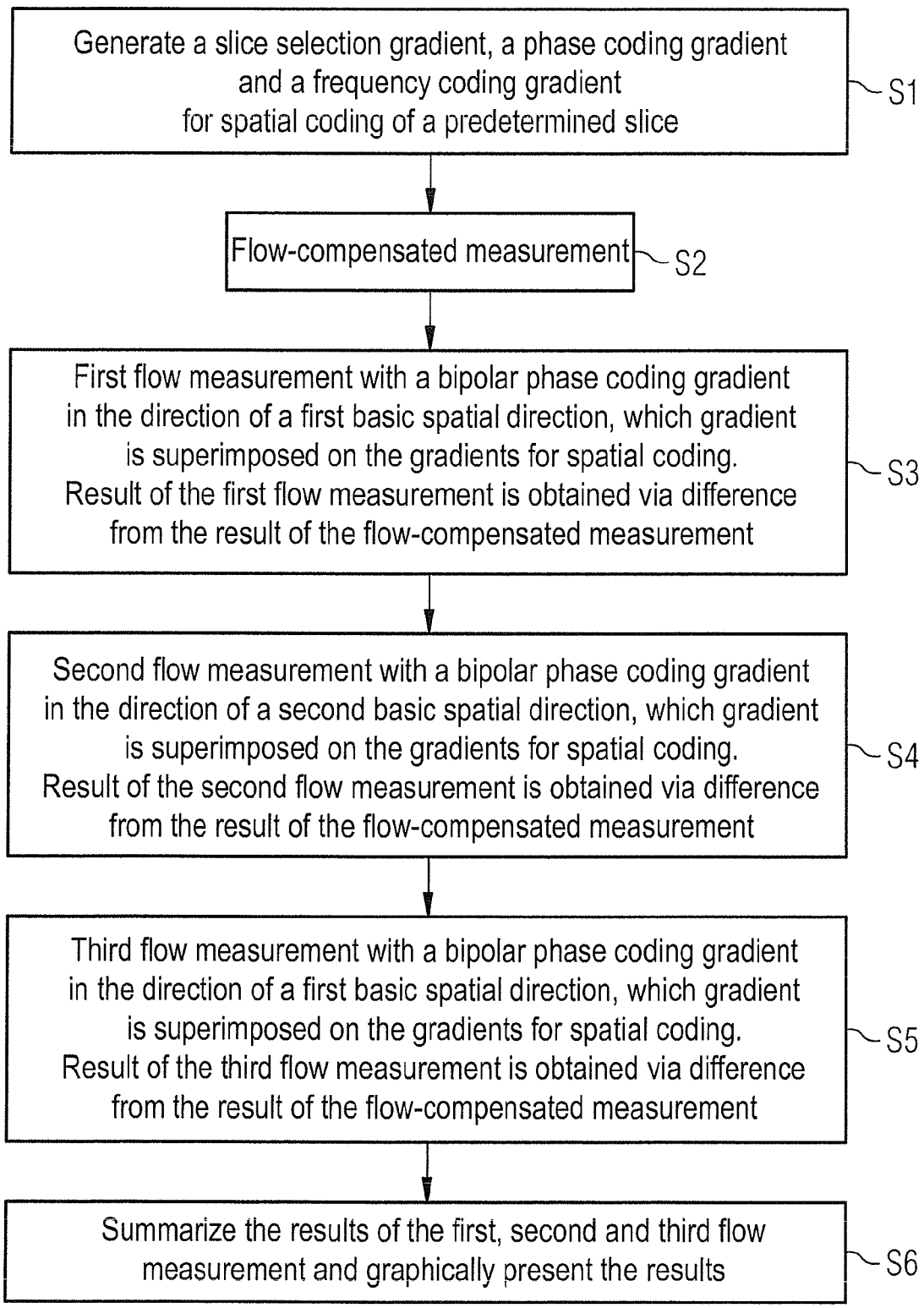
FIG. 4 is a flowchart of an embodiment of a method according to the invention for phase contrast flow measurement.

A workflow plan of a phase contrast flow measurement according to the invention is shown in FIG. 4.

In a first Step S1 a slice selection gradient, a phase coding gradient and a frequency coding gradient for spatial coding of a predetermined slice are generated or planned.

In a second Step S2 a flow-compensated measurement—i.e. an acquisition of MR data with a flow-compensated sequence—is implemented. The results of this flow-compensated measurement essentially serve as a reference for the flow measurements implemented in the following Steps S3 through S5.

The two first Steps S1 and S2 do not differ from the prior art.

In the third Step S3 a bipolar phase coding gradient is generated exclusively in the basic spatial direction Gx and superimposed on the gradient for spatial coding, and corresponding MR data are read out. The result of this first flow measurement in Step S3 is achieved in that the result data of the first flow measurement are subtracted from the result data of the flow-compensated measurement, wherein a velocity proportion or velocity vector along the first basic spatial direction Gx is determined for each pixel of the predetermined slice by means of the first flow measurement.

In a similar manner, respectively in step S4 and step S5 a bipolar phase coding gradient is generated exclusively in a second and third basic spatial direction Gy and Gz and is superimposed on the gradients for spatial coding. The results of the second and third flow measurement are calculated in turn in that the result data of the second and third flow measurement are subtracted from the result data of the flow-compensated measurement so that in the second and third flow measurement the velocity portion along the second and third basic spatial direction Gy and Gz is determined for every pixel of the predetermined space. In other words, in the three flow measurements implemented in the three Steps S3 through S5 three bipolar phase coding gradients are generated in the three basic spatial directions Gx, Gy and Gz and superimposed on the gradients for spatial coding, and the flow velocity is determined along the three basic spatial directions.

In the last Step S6 the results of the first, second and third flow measurement are summarized and the results are depicted graphically. For example, the velocity vectors (velocity portions) for each pixel can be calculated perpendicular to the predetermined slice via the velocity portions acquired in the three Steps S3 through S5, such that the flow velocity of a fluid perpendicular to the predetermined slice can be depicted for each pixel of the slice.

Figure 5:
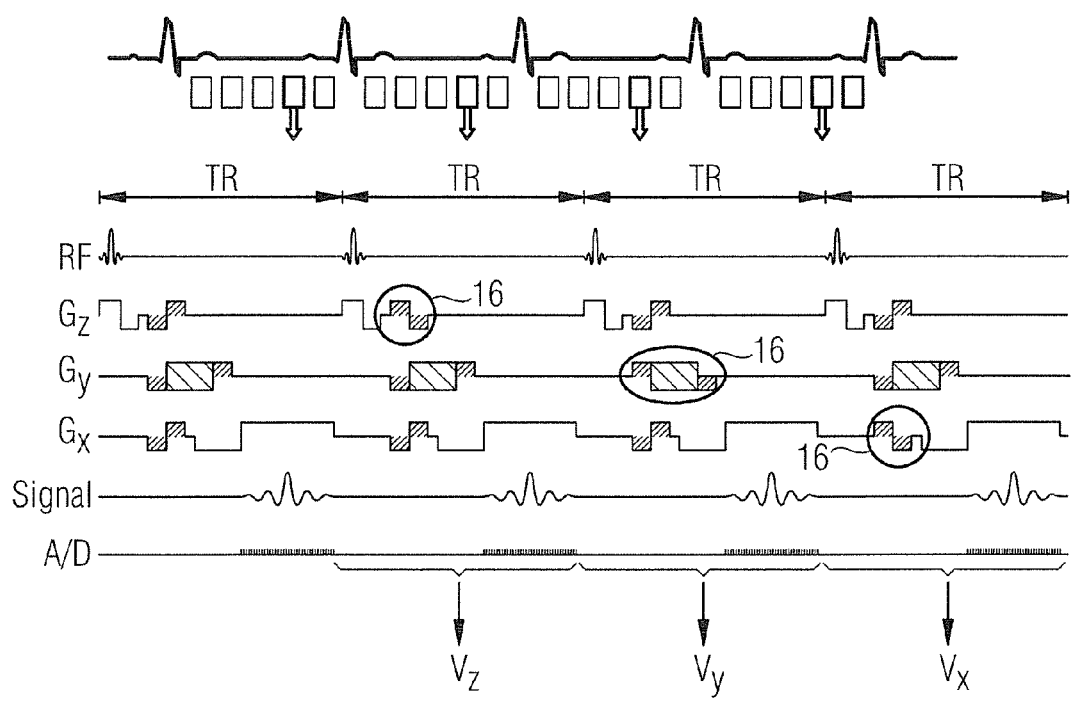
FIG. 5 is a flowchart of a further embodiment of a method for flow measurement according to the invention.

A sequence diagram for a method according to the invention for phase contrast flow measurement is shown in FIG. 5.

A flow-compensated measurement is thereby implemented during the first measurement period which is represented to the left by TR ("Time to Repetition"). In the second measurement period TR, the bipolar phase coding gradient is generated only along the basic spatial direction Gz and overlaid on the gradient for spatial coding so that the results of this measurement period determine the velocity portion Gz of the flow velocity per pixel of the predetermined slice along this basic spatial direction (z-axis).

In a similar manner, during the third measurement period the bipolar phase coding gradient is generated only along the basic spatial direction Gy and overlaid on the gradient for spatial coding so that the results of this measurement period show only the velocity portion Gy along the y-axis per pixel. Finally, during the fourth measurement period the bipolar phase coding gradient is generated only along the basic spatial direction Gx and overlaid on the gradient for spatial coding so that, in comparison to the previously invariant magnetic field gradient portions (Gx, Gy and Gz), only the velocity portion Gy along the x-axis (Gx) varies. Accordingly, during the fourth measurement period the velocity portion Vx is determined along the x-axis per pixel of the predetermined slice. Via the velocity portions Vx, Vy and Vz all three components are thus determined to construct the corresponding velocity vector per pixel, meaning that the magnitude of the flow velocity and the direction of the flow velocity are known per pixel.

Those points in FIG. 5 at which the overlay of the gradients for spatial coding with the phase coding gradients occurs are marked with the reference character 16. It is apparent that only one basic spatial direction is affected for the second through fourth measurement periods TR, and this is independent of the predetermined slice or, respectively, of the alignment of the predetermined slice.

In comparison to a method according to the prior art, during the second through fourth measurement periods TR the magnetic field gradients are varied only relative to one basic spatial direction (Gx, Gy or Gz) while, according to the prior art, all three basic spatial directions are varied in the second through fourth measurement periods TR given the mostly doubled oblique (angled) slices.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for phase-sensitive flow measurement of a volume segment of an examination subject by magnetic resonance, comprising the steps of:
    operating a magnetic resonance data acquisition unit, having a data acquisition coordinate system comprising three orthogonal spatial directions, in which a patient is located, to excite nuclear spins in a predetermined volume of the examination subject that comprises a flow therein, and thereby causing emission of magnetic resonance signals from the volume;
    operating said magnetic resonance data acquisition unit to generate imaging magnetic field gradients with an orientation that spatially encodes said magnetic resonance signals along said three orthogonal spatial directions;
    operating said magnetic resonance data acquisition unit to phase code flow information, representing the flow in the volume, by, in successive respective steps, superimposing a first flow information phase coding gradient and a second flow information phase coding gradient and a third flow information phase coding gradient on said imaging magnetic field gradients, said first flow information phase coding gradient being effective only in a first direction of said spatial directions, said second flow information phase coding gradient being effective only in a second direction of said spatial directions, and said third flow information phase coding gradient being effective only in a third direction of said spatial directions;
    in said magnetic resonance data acquisition unit, reading out said spatially encoded magnetic resonance signals and said phase encoded flow information from said volume, to obtain magnetic resonance data; and
    supplying said magnetic resonance data and said flow information to a computerized processor and, in said computerized processor, generating image data from said magnetic resonance data that represent an image of said volume with said flow information, and making said image data available as a data file at an output of said processor.

2. A method as claimed in claim 1 comprising, after acquiring each of said first flow information, said second flow information and said third flow information, automatically, in said computerized processor, correcting for any errors that exist along the respective first direction, second direction and third direction.

3. A method as claimed in claim 2 comprising, prior to acquiring said first flow information, said second flow information and said third flow information, implementing a calibration measurement in said data acquisition unit for each of said first direction, said second direction and said third direction, and correcting said first flow information, said second flow information and said third flow information using said calibration measurement.

4. A method as claimed in claim 1 comprising operating said magnetic resonance data acquisition unit to excite said nuclear spins in a slice of the examination subject, as said volume and acquiring said magnetic resonance data using a data acquisition procedure selected from the group consisting of two-dimensional magnetic resonance data acquisition procedures and three-dimensional magnetic resonance data acquisition procedures.

5. A magnetic resonance system for phase-sensitive flow measurement of a volume segment of an examination subject by magnetic resonance, comprising:

a magnetic resonance data acquisition unit having a data acquisition coordinate system comprising three orthogonal spatial directions and adapted to receive a patient therein, said data acquisition unit comprising an RF system that excites nuclear spins in a predetermined volume of the examination subject that comprises a flow therein, exciting nuclear spins in the examination subject to cause emission of magnetic resonance signals from the volume, and that receives said magnetic resonance signals;

said magnetic resonance data acquisition unit comprising a gradient coil system and a gradient control unit that operates said gradient coil system to generate imaging magnetic field gradients with an orientation that spatially encodes said magnetic resonance signals along said three orthogonal spatial directions;

said gradient control unit also being configured to operate said gradient coil system to phase code flow information, representing the flow in the volume, by, in successive respective steps, superimposing a first flow information phase coding gradient and a second flow information phase coding gradient and a third flow information phase coding gradient on said imaging magnetic field gradients, said first flow information phase coding gradient being effective only in a first direction of said spatial directions, said second flow information phase coding gradient being effective only in a second direction of said spatial directions, and said third flow information phase coding gradient being effective only in a third direction of said spatial directions;

said gradient control unit also being configured to operate said gradient coil system to read out said spatially encoded magnetic resonance signals and said phase coded flow information from said volume, to obtain magnetic resonance data; and a computerized processor supplied with said magnetic resonance data and said flow information, said computerized processor being configured to generate image data from said magnetic resonance data that represent an image of said volume with said flow information, and to make said image data available as a data file at an output of said processor.

6. A magnetic resonance system as claimed in claim 5 wherein said computerized processor is configured, after acquiring each of said first flow information, said second flow information and said third flow information, to automatically correct any errors that exist along the respective first direction, second direction and third direction.

7. A magnetic resonance system as claimed in claim 6 comprising a control unit configured to operate said data acquisition unit, prior to acquiring said first flow information, said second flow information and said third flow information, to implement a calibration measurement in said data acquisition unit for each of said first direction, said second direction and said third direction, and wherein said computerized processor is configured to correct said first flow information, said second flow information and said third flow information using said calibration measurement.

8. A magnetic resonance system as claimed in claim 5 wherein said computerized processor is configured operate said magnetic resonance data acquisition unit to excite said nuclear spins in a slice of the examination subject, as said volume and acquiring said magnetic resonance data using a data acquisition procedure selected from the group consisting of two-dimensional magnetic resonance data acquisition procedures and three-dimensional magnetic resonance data acquisition procedures.

9. A non-transitory computer-readable storage medium encoded with programming instructions, said storage medium being loaded into a computerized operating and evaluation system of a magnetic resonance system, said magnetic resonance system comprising a magnetic resonance data acquisition unit having a data acquisition coordinate system comprising three orthogonal spatial directions, said programming instructions causing said computerized operating and evaluation system to:

operate the magnetic resonance data acquisition unit with a patient located therein, to excite nuclear spins in a predetermined volume of the examination subject that comprises a flow therein, to cause emission of magnetic resonance signals from the volume;

operate said magnetic resonance data acquisition unit to generate imaging magnetic field gradients with an orientation that spatially encodes said magnetic resonance signals along said three orthogonal spatial directions;

operate said magnetic resonance data acquisition unit to phase code flow information, representing the flow in the volume, by, in successive respective steps, superimposing a first flow information phase coding gradient and a second flow information phase coding gradient and a third flow information phase coding gradient on said imaging magnetic field gradients, said first flow information phase coding gradient being effective only in a first direction of said spatial directions, said second flow information phase coding gradient being effective only in a second direction of said spatial directions, and said third flow information phase coding gradient being effective only in a third direction of said spatial directions;

operate said magnetic resonance data acquisition unit to read out said spatially encoded magnetic resonance signals and said phase coded flow information from said volume, to obtain magnetic resonance data; and generate image data from said magnetic resonance data that represent an image of said volume with said flow information, and make said image data available as a data file at an output of said processor.

* * * * *